United States Patent
Ito et al.

(10) Patent No.: US 7,236,406 B2
(45) Date of Patent: Jun. 26, 2007

(54) METHOD OF ERASING DATA IN NON-VOLATILE SEMICONDUCTOR MEMORY DEVICE WHILE SUPPRESSING VARIATION

(75) Inventors: Takashi Ito, Tokyo (JP); Hidenori Mitani, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 5 days.

(21) Appl. No.: 11/328,224

(22) Filed: Jan. 10, 2006

(65) Prior Publication Data

US 2006/0158939 A1 Jul. 20, 2006

(30) Foreign Application Priority Data

Jan. 20, 2005 (JP) .............................. 2005-012645

(51) Int. Cl.
*G11C 16/34* (2006.01)
(52) U.S. Cl. .............................. 365/185.3; 365/185.22; 365/185.24; 365/185.29
(58) Field of Classification Search .............. 365/185.3
See application file for complete search history.

(56) References Cited

U.S. PATENT DOCUMENTS 5,400,286 A * 3/1995 Chu et al. .............. 365/185.19
5,424,993 A * 6/1995 Lee et al. .................... 365/218
5,886,927 A * 3/1999 Takeuchi ................ 365/185.22
6,483,752 B2 * 11/2002 Hirano ................... 365/185.33
6,639,844 B1 * 10/2003 Liu et al. ................. 365/185.3

FOREIGN PATENT DOCUMENTS

JP 06-028875 2/1994
JP 2001-357680 A 12/2001

* cited by examiner

*Primary Examiner*—Tan T. Nguyen
(74) *Attorney, Agent, or Firm*—McDermott Will & Emery LLP

(57) ABSTRACT

According to a method of erasing data in a non-volatile semiconductor memory device, block-round type overerase verify is performed. Specifically, overerase verify and write back are performed sequentially from a first address to a last address. That is, even when a write back pulse is applied after a certain address is selected and verify is performed, address increment from one address to another is performed, regardless of whether verify has been performed or not. Therefore, it is not that the same address is cumulatively rewritten, but write back to a memory cell corresponding to a defective address is sequentially and gradually performed. Accordingly, as write to a memory cell in an overerased state can evenly be performed, influence by off-leakage is suppressed, and a memory cell having threshold voltage distribution with less variation can be implemented.

6 Claims, 16 Drawing Sheets

METHOD OF ERASING DATA IN NON-VOLATILE SEMICONDUCTOR MEMORY DEVICE WHILE SUPPRESSING VARIATION

BACKGROUND OF THE INVENTION

1. Field of the Invention

The present invention relates to a method of erasing data in a non-volatile semiconductor memory device.

2. Description of the Background Art

Conventionally, when a data stored in an electrically data-erasable and rewritable non-volatile semiconductor memory device is erased, a data erase operation has been performed after data is initially written into all memory cell transistors (hereinafter, also simply referred to as memory cell) so as to set all memory cells in a data-written state (a state in which prescribed data has been written) (hereinafter, also referred to as write-before-data-erase).

Generally, as a threshold voltage of a memory cell is varied depending on a state of data write, various threshold values tend to be present. In other words, distribution of threshold voltages of the memory cells is widespread. Accordingly, unless the threshold voltages are accommodated within a certain range through write-before-data-erase before a data erase operation, distribution of the threshold voltages becomes further widespread due to a data erase operation for the memory cell.

On the other hand, if distribution of the threshold voltages of the memory cells is widespread, that is, when the threshold voltages are various, erroneous data is read from a memory cell in a data read operation. Namely, in order to secure a data read margin, suppression of variation is an important issue.

In order to address this issue, a data erase method capable of suppression of variation and regulation of the threshold voltage has been proposed.

For example, Japanese Patent Laying-Open No. 2001-357680 discloses a scheme for preventing variation of the threshold voltages by repeating erase and write so as to gradually lower the threshold voltage. In this scheme, however, erase and write should be performed for each bit as well as a verify operation should be performed for each of these operations, which results in time-consuming data erase operation.

Meanwhile, Japanese Patent Laying-Open No. 06-028875 discloses a scheme for performing data write from an overerased state after all memory cells are set to the overerased state. Specifically, this publication proposes the scheme in which verify and write are performed while a non-selected word line is at a negative voltage during verify for cutting off-leakage of the memory cell in the overerased state. Namely, this publication discloses a scheme for regulating the threshold voltage such that the threshold voltage is within a certain range.

Japanese Patent Laying-Open No. 06-028875 discloses a scheme to regulate the threshold voltage of the selected memory cell by setting the non-selected word line to a negative voltage at the time of verify so as to suppress the off-leakage current. In general, however, in actual data read, the non-selected word line is set not to the negative voltage but to a ground voltage (0V). Therefore, even when the threshold voltage of the memory cell is regulated by sufficiently suppressing the off-leakage current at the time of verify, suppression of the off-leakage current is not sufficient under a condition of actual data read, that is, a condition in which the non-selected word line is set to 0V.

SUMMARY OF THE INVENTION

The present invention was made to solve the above-described problems. An object of the present invention is to provide a method of erasing data in a non-volatile semiconductor memory device, capable of suppressing variation by performing verify under a condition of actual data read, taking into consideration an actual off-leakage current.

In a method of erasing data in a non-volatile semiconductor memory device according to the present invention, at least one of verify and write with respect to a plurality of memory cell transistors arranged in an integrated manner in matrix is repeatedly performed so that a threshold voltage is within a range from at least a first voltage to at most a second voltage. The method of erasing data in a non-volatile semiconductor memory device includes the steps of: performing an erase operation so that the threshold voltage of each of the memory cell transistors is set to at most the second voltage; and performing a verify write operation in which verify is performed in such a manner that the first voltage is applied to a control gate of a memory cell transistor corresponding to a selected memory cell row, to carry out threshold voltage determination as to whether the memory cell transistor is to be turned on or remains off, and write is performed based on a result of verify. The step of performing a verify write operation includes the steps of: performing first verify write in which verify is performed in such a manner that the first voltage is applied to the control gate of the memory cell transistor corresponding to the selected memory cell row and a third voltage lower than a normal off voltage is applied to a control gate of a memory cell transistor corresponding to a non-selected memory cell row, and write to the memory cell transistor corresponding to the selected memory cell row is repeated based on a result of verify; and performing second verify write in which verify is performed in such a manner that the first voltage is applied to the control gate of the memory cell transistor corresponding to the selected memory cell row and the normal off voltage is applied to the control gate of the memory cell transistor corresponding to the non-selected memory cell row, and write to the selected memory cell row is repeated based on a result of verify. In the step of performing second verify write, cyclic writing is performed, in which verify is performed sequentially from the memory cell transistor corresponding to the selected memory cell row corresponding to a first address to the memory cell transistor corresponding to the selected memory cell row corresponding to a last address, once for each, and write is repeated based on a result of verify.

In the method of erasing data in a non-volatile semiconductor memory device according to the present invention, the first voltage is applied to the control gate of each memory cell transistor for verify determination. Specifically, cyclic writing is performed, in which verify is performed sequentially from the selected memory cell transistor corresponding to the first address to the selected memory cell transistor corresponding to the last address, once for each, and write is repeated based on a result of verify. In addition, the normal off voltage is applied to the control gate of the non-selected memory cell transistor. In other words, write to a plurality of memory cell transistor is evenly performed. According to this erase method, a memory cell transistor having threshold voltage distribution with less variation, in which verify is performed under the condition of actual data read and influence by off-leakage is suppressed, can be obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
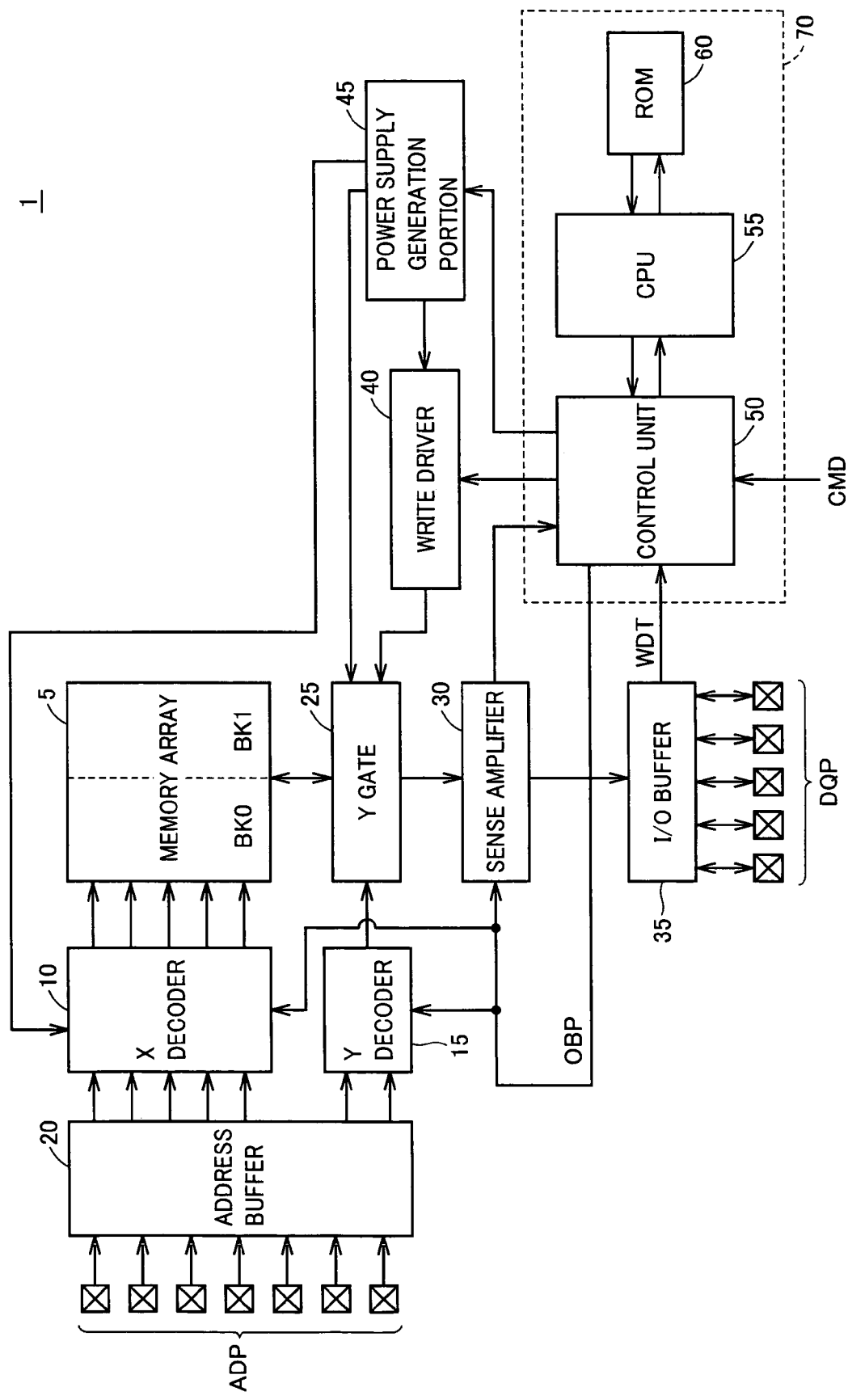
FIG. 1 is a schematic block diagram of a non-volatile semiconductor memory device according to an embodiment of the present invention.

An embodiment of the present invention will be described hereinafter in detail with reference to the drawings. The same or corresponding elements have the same reference characters allotted, and detailed description thereof will not be repeated.

First Embodiment

Referring to FIG. 1, a non-volatile semiconductor memory device 1 according to an embodiment of the present invention includes a memory array 5 including memory cells arranged in an integrated manner in matrix, an X decoder 10 and a Y decoder 15 for selecting a plurality of word lines provided in correspondence with memory cell rows respectively and a plurality of bit lines provided in correspondence with memory cell columns respectively, an address buffer 20 for subjecting an address signal externally input through an address pin ADP to buffer processing and transmitting the resultant signal to X decoder 10 and Y decoder 15, a Y gate 25 operating in response to a selection instruction from Y decoder 15 and controlling electrical connection between a selected bit line and a sense amplifier 30 or a write driver 40, sense amplifier 30 amplifying data read from memory array 5, an I/O buffer 35 outputting the data amplified by sense amplifier 30 or subjecting the data externally input through a data pin DQP to buffer processing and outputting the resultant data to a control unit 50, write driver 40 for writing data into an address-selected memory cell in memory array 5, a power supply generation portion 45 for supplying write driver 40 and the like with a voltage, and a control portion 70 for overall control of non-volatile semiconductor memory device 1. It is noted that memory array 5 is divided into a plurality of blocks. In the present embodiment, it is assumed that memory array 5 is exemplarily divided into blocks BL0, BK1. It is also assumed that an erase operation according to the embodiment of the present invention is performed for each block unit.

Control portion 70 includes control unit 50 outputting various control signals to an internal circuit in response to an external command CMD, a CPU 55 for performing operational processing, and a storage area ROM 60 for storing a program or the like used for a prescribed operation of semiconductor memory device 1. Control unit 50 receives input of data WDT from I/O buffer 35, outputs the same to write driver 40 as write data, and performs a verify operation upon receiving read data from sense amplifier 30. For example, control unit 50 transmits a control signal OBP for activating the internal circuit at the time of verify or the like to X decoder 10, Y decoder 15 and sense amplifier 30 in response to command CMD, so as to cause these components to enter an operation state.

Figure 2:
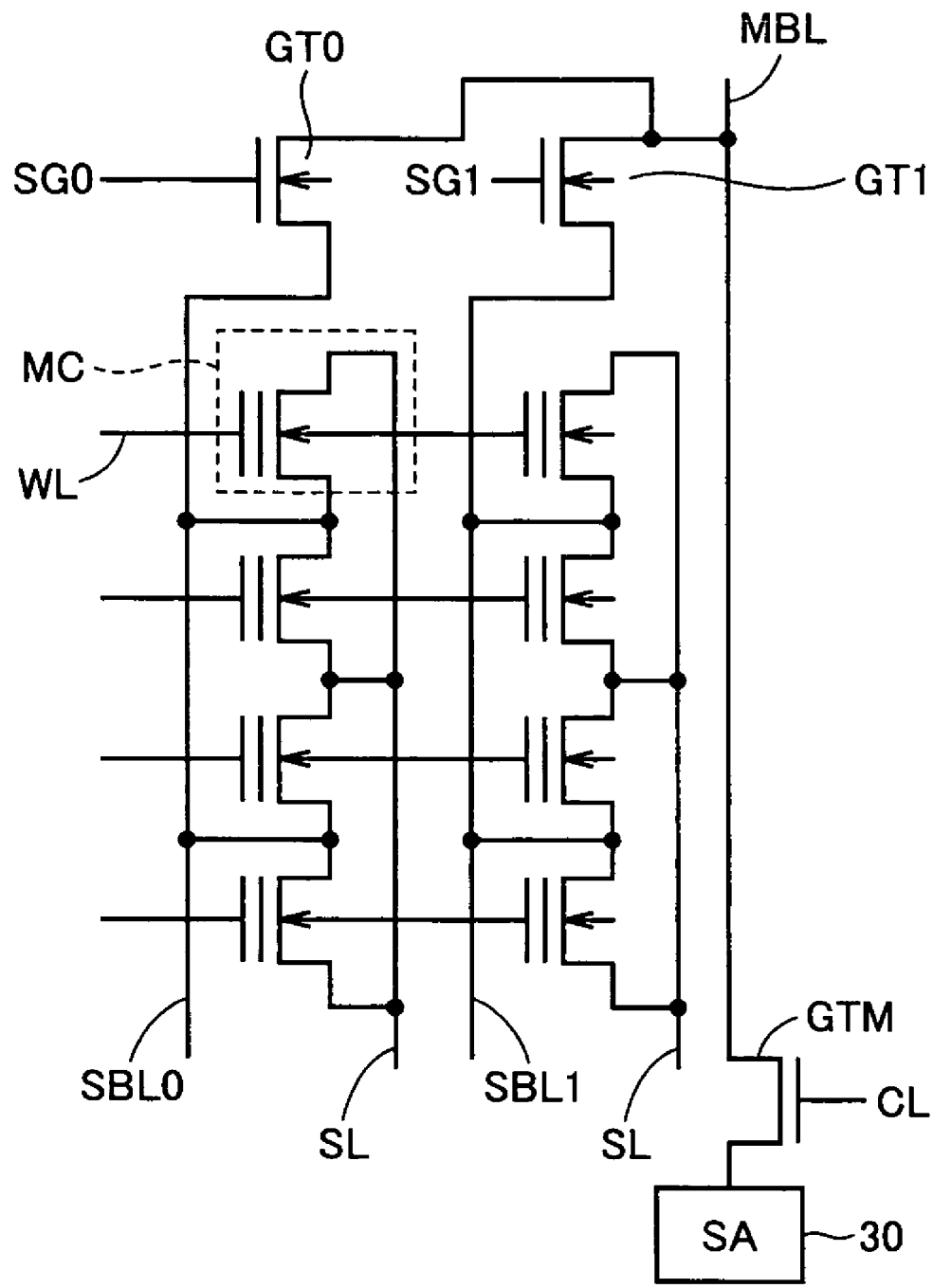
FIG. 2 illustrates a partial configuration of a memory array.

Referring to FIG. 2, memory array 5 according to the embodiment of the present invention includes a plurality of memory cells MC capable of non-volatile data storage, that are arranged in an integrated manner in matrix, a plurality of word lines WL provided in correspondence with memory cell rows respectively, and a plurality of bit lines provided in correspondence with memory cell columns respectively. Here, a flash memory having a threshold voltage varied in accordance with storage data is shown as an example of memory cell MC.

In FIG. 2, sub bit lines SBL are provided in correspondence with the memory cell columns respectively, and a main bit line is provided for the plurality of sub bit lines. Specifically, a main bit line MBL is provided for two sub bit lines SBL0, SBL1.

In addition, a gate transistor implementing Y gate 25 is provided between sub bit line SBL and main bit line MBL. In the present embodiment, gate transistors GT0, GT1 are provided between sub bit lines SBL0, SBL1 and main bit line MBL, and they are turned on in response to control signals SG0, SG1 respectively. Moreover, a column select gate GTM implementing the Y gate is provided between main bit line MBL and sense amplifier 30, and it is turned on in response to a control signal CL.

In the present embodiment, one main bit line MBL is described by way of example, however, the present embodiment is not limited thereto and a plurality of main bit lines are provided. In addition, the number of the sub bit lines is not limited to two. Furthermore, such a configuration that a plurality of sub bit lines SBL are electrically coupled to main bit line MBL may be possible.

For example, Y decoder 15 outputs control signal SG0 and control signal CL in response to an address signal transmitted from address buffer 20. In response, gate transistors GT0 and GTM are turned on, so that column selection in accordance with the input address can be carried out.

Figure 3:
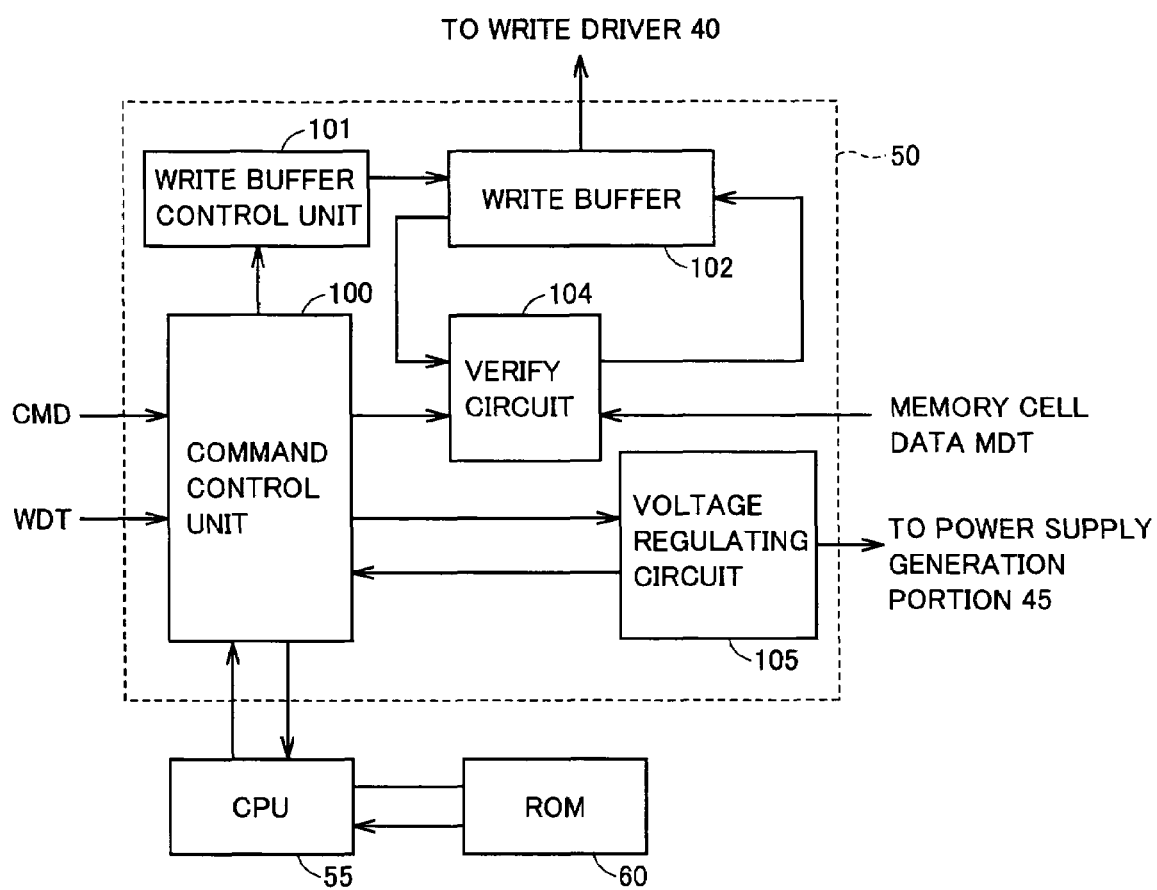
FIG. 3 is a schematic block diagram of a control unit.

Referring to FIG. 3, control unit 50 according to the embodiment of the present invention includes a command control unit 100, a write buffer control unit 101, a write buffer 102, a verify circuit 104, and a voltage regulating circuit 105. Command control unit 100 outputs various control signals to each circuit in response to an input of external command CMD. Write buffer control unit 101 receives input of write data WDT that is input through command control unit 100, subjects the data to buffer processing, and outputs the resultant data to write buffer 102. Write buffer 102 sets write data for output to write driver 40, based on write data input from write buffer control unit 101 or write data input from verify circuit 104. Specifically, write buffer 102 has a register for cumulative determination which will be described later, and sets data for output to write driver 40 based on a result of verify from verify circuit 104.

Verify circuit 104 receives input of memory cell data MDT (read data) read from the memory array, and performs a verify operation for comparing the data with an expected value that has been stored in advance. If it is determined that the data is defective, the result to that effect is output to write buffer 102. Voltage regulating circuit 105 operates in response to a control instruction from command control unit 100, and regulates the voltage level of power supply generation portion 45. Various voltage levels supplied from power supply generation portion 45 are thus regulated. For example, the voltage level of word line WL to which a write pulse is applied is also regulated by voltage regulating circuit 105.

A method of erasing data in the non-volatile semiconductor memory device according to the embodiment of the present invention will now be described.

The method of erasing data in a non-volatile semiconductor memory device according to the first embodiment of the present invention will be described with reference to FIG. 4.

In the erase method according to the present embodiment, the erase operation for the memory cell is performed for each block unit, the block being obtained as a result of division of the memory array. In the erase method according to the present embodiment, it is not particularly necessary to achieve uniform threshold voltages through write-before-data-erase described above, so as to suppress variation of the threshold voltages of the memory cells through verify and write back processing which will be described later. In the present embodiment, as to an upper limit and a lower limit of the threshold voltage of the memory cell, it is considered that they are in a range from 2.7V to 2.0V.

Initially, data erase is started (step S0).

Thereafter, an erase pulse is applied to the memory cell (step S0#). Specifically, for example, a voltage of −10V is applied to each word line WL, and for example, a voltage of 5V is applied to the source electrode of each cell, so as to perform erase.

Then, erase verify for determining the threshold voltage of the data-erased memory cell is performed (step S1). Specifically, for example, a voltage of 2.7V corresponding to the upper limit threshold voltage is applied to word line WL, and sub bit line SBL is selected. The threshold voltage of the memory cell located at an intersection of word line WL and the sub bit line is thus read, and whether this threshold voltage is not higher than an erase determination level, for example of 2.7V, is determined (erase verify) (step S1). It is assumed here that verify determination is performed in verify circuit 104 described above, and this is also the case for various types of verify hereinafter.

At the time of erase verify, the control gate of the non-selected memory cell is set to a negative voltage (such as −2V) not higher than the normal off voltage (0V) through word line WL. As a result, the off-leakage current of the non-selected memory cell, that serves as a factor to interfere data read during verify, is suppressed, and data read from a target memory cell can be performed.

When it is determined at step S1 that the erase determination level is not exceeded in all memory cells, that is, all memory cells are determined as pass (PASS) in erase verify, the process proceeds to step S3.

On the other hand, if it is determined at step S1 that the threshold voltage is higher than e.g., 2.7V, determination as fail (FAIL) is made, and application of the erase pulse is again performed for another erase (step S2). The process returns to step S1, at which erase verify described above is performed. Such additional erase and erase verify are repeated until the threshold voltage is set to 2.7V or lower. This operation is repeated for all bits. Specifically, the word line corresponding to the selected memory cell row and the selected sub bit line are accessed for example in correspondence with the input address. When it is confirmed that the memory cell at the intersection of the sub bit line and the word line is in the erased state, the address is incremented, and a memory cell corresponding to the next address is selected. For example, a word line in the next row, that is, the adjacent word line is selected, and erase verify (step S1) and application of erase pulse (step S2) are repeatedly performed in a similar manner. This erase verify is repeated for all word lines. In this manner, erase determination of the memory cell corresponding to a prescribed, selected sub bit line can be performed. Thereafter, a sub bit line in the next column, that is, an adjacent sub bit line is selected, and erase verify (step S1) and application of erase pulse (step S2) are repeatedly performed in a similar manner. This erase verify is repeated for all word lines. Then, the processing described above is sequentially repeated also for other sub bit lines. Erase determination for all memory cells present in the memory array can thus be performed. Though an example in which erase verify and application of erase pulse are performed for each bit for the sake of simplification, the present embodiment is not limited as such. In a configuration where parallel data read and write is allowed, erase verify and application of the erase pulse with respect to a selected memory cell group in accordance with selection of the word line can be performed in parallel. In the present embodiment, a configuration in which batch erase verify and application of the erase pulse with respect to a selected memory cell group in accordance with selection of the word line can be performed will be described. It is assumed that address increment is performed in accordance with a scheme similar to erase determination described above also in verify and write back processing which will be described below.

Thereafter, at step S3, overerase verify is performed. Specifically, a potential of the word line is set to 2.0V corresponding to the lower limit threshold voltage, and a bit line is selected. The threshold voltage of the memory cell located at an intersection of the word line and the bit line is thus read, and whether this threshold voltage is not lower than 2.0V, that is, whether the memory cell is overerased, is determined (step S3). A negative voltage (−2V) lower than the normal off voltage (0V) is applied to the word line, i.e., the control gate, of the non-selected memory cell at the time of overerase verify, such that a current does not flow in the overerased memory cell.

If it is determined at step S3 that the memory cell is in the overerased state, a write back pulse is applied at step S4 (step S4). Here, a width of the write back pulse is set to be narrow. As a result of application of such a pulse, a shift amount of the threshold voltage is suppressed to be small enough to gradually raise the voltage.

The processing for overerase verify and write back is repeated until the threshold voltage is determined as pass with regard to the lower limit threshold voltage, that is, until all the memory cells are no longer in the overerased state. This is the operation of overerase recovery (OER1).

Figure 5:
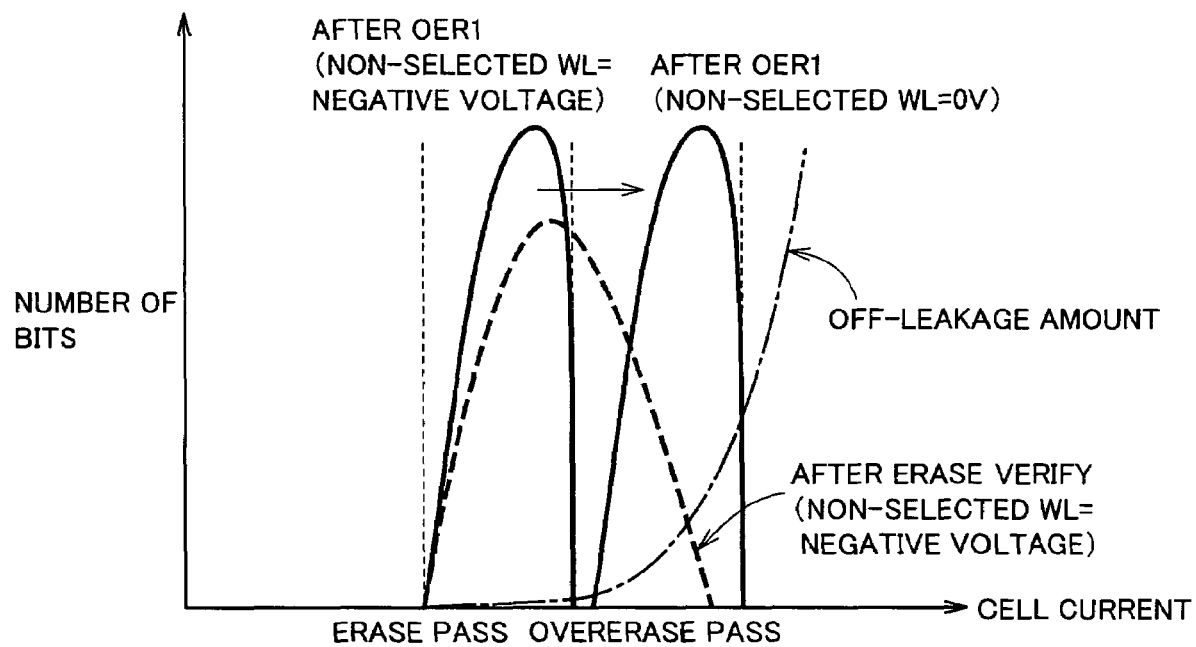
FIG. 5 illustrates distribution of memory cells after erase verify and a distribution state of memory cells after over-erase recovery.

FIG. 5 illustrates distribution of memory cells after erase verify and a distribution state of memory cells after overerase recovery (also denoted as OER1). In FIG. 5, the ordinate represents the number of bits in the memory cell, while the abscissa represents a cell current, that is, an amount of current that flows through the cell. Though the abscissa represents the cell current, the cell current correlates with the threshold voltage of the memory cell. Here, as the threshold voltage is higher, the cell current is smaller. On the other hand, as the threshold voltage is lower, the cell current is larger. In other words, in terms of the threshold voltage, the left side of the abscissa indicates a higher threshold voltage of the memory cell, while the right side thereof indicates a lower threshold voltage of the memory cell. Though a distribution state of the memory cells will be described hereinafter in terms of a cell current, it can naturally be described in terms of a state of the threshold voltage.

As shown with a dashed line in FIG. 5, distribution of the memory cells after erase verify at step S1 is considerably widespread. Though not shown, memory cells extremely distant from an overerase pass are also present.

As described above, a large number of memory cells are distributed beyond the overerase pass, although they are in an erase pass state.

The data erase method according to the embodiment of the present invention aims to accommodate the distribution state of the memory cells between the erase pass and the overerase pass. It is assumed here that the threshold voltage of the erase pass is set to 2.7V and the threshold voltage of the overerase pass is set to 2.0V.

A waveform shown with a solid line represents distribution of the memory cells after OER1. As shown in FIG. 5, after OER1 (non-selected WL=negative voltage (−2V)), the memory cells are apparently accommodated between the erase pass and the overerase pass. This state, however, shows an example in which the non-selected word line WL is set to a negative voltage (−2V), an off-leakage amount of the non-selected memory cell is cut, and verify and write back are performed. Meanwhile, in actual data read, non-selected word line WL is set to the off voltage (0V). Therefore, distribution of the memory cells in that state, i.e., in actual data read, is represented by a waveform shifted to the right as shown with an arrow. This waveform is labeled as "after OER1 (non-selected WL=0V)". This state is present in an area where the cell current is large, on the right of the overerase pass. As shown in particular in FIG. 5, as the cell current becomes larger (the threshold voltage is lower), the off-leakage amount exponentially increases.

Therefore, even if distribution of the memory cells can apparently be accommodated in the area on the left relative to the overerase pass as a result of OER1 in which non-selected word line WL is set to a negative voltage, the off-leakage amount is suppressed and write back is performed, the memory cells are still in the overerased state when non-selected word line WL is actually set to off voltage (0V). It is thus difficult to accommodate the memory cells between the erase pass and the overerase pass with one OER1. Here, write back while non-selected word line WL is set to the normal off voltage (0V) may be possible at the time of initial OER1. If many memory cells in the overerased state are present, however, write back to the target memory cell may not be possible, because a current path through the memory cells in the overerased state is formed.

Therefore, even when OER1 (non-selected WL=negative voltage) is performed, another overerase recovery should be performed, that is, a verify operation and write back in which non-selected word line WL is set to the normal off voltage (0V) should be performed.

Thereafter, block-round type overerase verify (limited number of times) according to the first embodiment of the present invention is performed (step S5).

A flowchart for block-round type overerase verify according to the first embodiment of the present invention will be described in detail with reference to FIG. 6.

Figure 6:
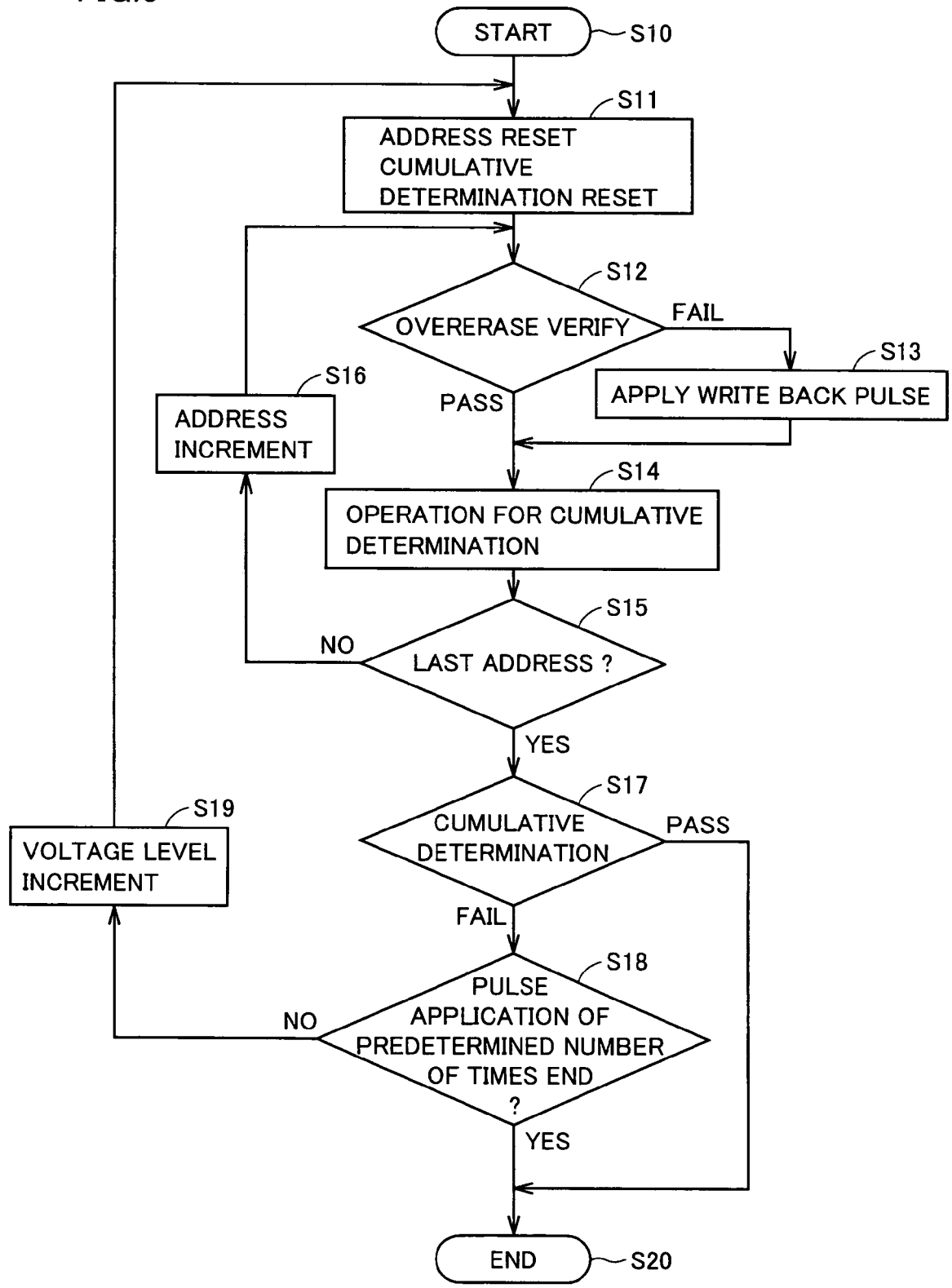
FIG. 6 illustrates in detail a flowchart for block-round type overerase verify according to the first embodiment of the present invention.

Referring to FIG. 6, initially at step S10, block-round type overerase verify is started (step S10). Thereafter, at step S11, address reset and cumulative determination reset are performed in order to set an initial state. Specifically, a register for cumulative determination used in a cumulative determination operation which will be described later is reset to "1".

At step S12, overerase verify is performed. Specifically, a potential of the word line is set to 2.0V corresponding to the lower limit threshold voltage, and a bit line is selected. The threshold voltage of the cell located at an intersection of the word line and the bit line is thus read, and whether this threshold voltage is not lower than 2.0V is determined. A voltage of 0V, which is the off voltage, is applied to the word line, i.e., the control gate, of the non-selected cell at the time of overerase verify, in order to set a condition the same as in actual data read.

If it is determined at step S12 that the memory cell is in the overerased state, a write back pulse is applied at step S13 (step S13). The process then proceeds to step S14. Here, a width of the write back pulse is set to be narrow. As a result of application of such a pulse, a shift amount of the threshold voltage is suppressed to be small.

In block-round type overerase verify, even if it is determined that the memory cell is in the overerased state, it is not that the processing for overerase verify and write back is repeated until the threshold voltage is set to a voltage of at least 2.0V, that is, until all the memory cells are no longer in the overerased state.

The verify operation is performed as shown in FIG. 6, and a result thereof is stored in a register for cumulative determination (not shown) within write buffer 102. Specifically, data "1" is set in advance in the register for cumulative determination. If the result indicates pass (PASS), "1" is input to the register for cumulative determination, and if the result indicates fail (FAIL), "0" is input, whereby an AND logic operation result is executed (step S14). That is, the operation result is set again in the register for cumulative determination.

As described above, when the result of verify indicates pass (PASS), "1" is set. On the other hand, if the result of verify indicates fail (FAIL), "0" is set. Therefore, by executing the AND logic operation result, contents in the register remain as "1" if determination as pass is made for all memory cells. On the other hand, if there is a single memory cell that is determined as fail, the contents in the register are changed to "0".

This operation is repeated for each verify operation, so that accumulation of the result of verify can be retained. Thereafter, whether or not an address of the memory cell to be subjected to verify is the last address is determined (step S15). If the address of the memory cell to be subjected to verify is not the last address, the process proceeds to next step S16, at which address increment is performed (step S16). Specifically, as described above, another word line, for example an adjacent word line, is selected at least once in a prescribed order, from the first address to the last address.

On the other hand, if it is determined at step S15 that the address of the memory cell to be subjected to verify is the last address, cumulative determination is finally performed (step S17). In cumulative determination, after verify makes a round and reaches the last address, the contents in the cumulative determination register are confirmed, and overall pass/fail is determined.

If the contents in the cumulative determination register remain "1", determination as pass is made, and block-round type overerase verify is completed (step S20). On the other hand, if there is a single fail, the process proceeds to the next step, at which whether application of the pulse as many times as the number of predetermined times has been completed is determined (step S18).

At step S18, when application of the pulse as many times as the number of predetermined times is completed, the process proceeds to step S20. On the other hand, when application of the pulse as many times as the number of predetermined times is not completed at step S18, the voltage level is incremented (step S19). Namely, the voltage level is set such that a slightly higher voltage pulse is applied in accordance with the number of rounds and write back is performed. Thereafter, the process proceeds to step S11, at which overerase verify and write back are performed sequentially from the first address to the last address.

According to block-round type overerase verify of the present embodiment, it is not that write back to the memory cell in the memory cell row of the same address is repeated until verify determination as pass is made. Instead, write back to the memory cell is performed only when necessary, and when not necessary, overerase verify and write back to the memory cell in the memory cell row corresponding to the next address are performed.

In other words, even when the memory cell corresponding to the memory cell row corresponding to a certain address is selected and subjected to verify and thereafter a write back pulse is applied thereto, regardless of whether verify has been performed or not, increment to a memory cell in a memory cell row corresponding to one address after another is carried out. Therefore, it is not that the memory cell at the same address is cumulatively rewritten. In other words, it is not that what is called intensive rewrite as in overerase recovery OER1 is performed, but that write back is gradually and sequentially performed with respect to the memory cell corresponding to the memory cell row corresponding to the defective address.

Figure 7:
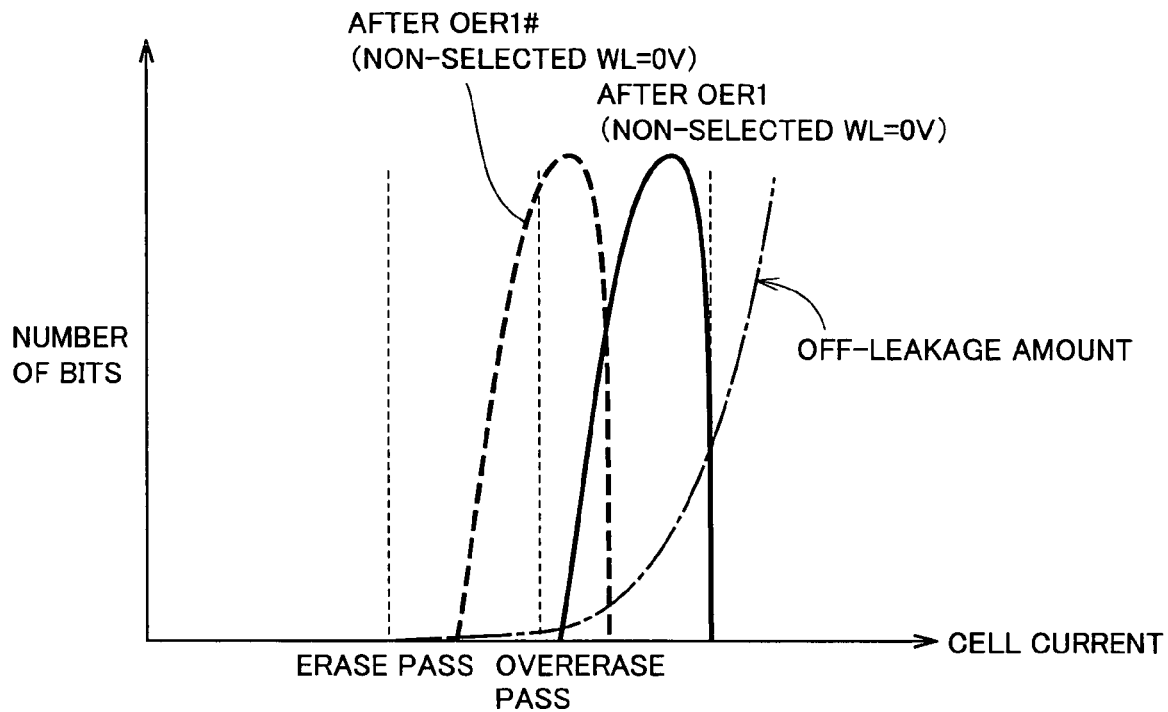
FIG. 7 illustrates distribution of memory cells when block-round type overerase verify is performed in the first embodiment of the present invention.

FIG. 7 illustrates distribution of memory cells when block-round type overerase verify (OER1#) is performed in the first embodiment of the present invention.

As shown in FIG. 7, while maintaining distribution substantially the same as after OER1, distribution of the memory cells moves to the left in a direction in which the cell current decreases, i.e., comes closer to the erase pass and the overerase pass. The off-leakage current can thus be reduced. It is noted that the distribution of the memory cells is not yet accommodated between the erase pass and the overerase pass which is to be finally achieved, because the number of times of OER1# is limited.

Referring again to FIG. 4, the process proceeds to step S6.

At step S6, overerase verify is performed. Specifically, a potential of the word line is set e.g., to 2.0V corresponding to the lower limit threshold voltage, and a bit line is selected. The threshold voltage of the memory cell located at an intersection of the word line and the bit line is thus read, and whether this threshold voltage is not lower than 2.0V is determined (step S6). A voltage of 0V, which is the off voltage of non-selected word line WL, is applied to the word line, i.e., the control gate, of the non-selected memory cell at the time of overerase verify, under the condition the same as in the normal state.

If it is determined at step S6 that the memory cell is in the overerased state, a write back pulse is applied at step S7 (step S7). Here, a width of the write back pulse is set to be narrow. As a result of application of such a pulse, a shift amount of the threshold voltage is suppressed to be small.

The processing for overerase verify and write back is repeated until the threshold voltage is set to at least 2.0V which is the lower limit threshold voltage, that is, until all the memory cells are no longer in the overerased state. This is the operation of overerase recovery (OER2).

Finally, erase verify is performed (step S8). Specifically, for example, a voltage of 2.7V corresponding to the upper limit threshold voltage is applied to word line WL, and a sub bit line is selected. The threshold voltage of the memory cell located at an intersection of word line WL and the sub bit line is thus read, and whether this threshold voltage is not higher than the erase determination level of e.g., 2.7V representing the upper limit of the threshold voltage is determined. Namely, determination as to erase pass of the memory cell is made (step S8).

In this manner, whether the memory cells are accommodated between the erase pass and the overerase pass can be confirmed.

If erase pass of the memory cells is determined at step S8, the erase operation is finally completed (step S9).

In contrast, if the memory cell is present on the left of the erase pass, that is, if it is determined at step S8 that the memory cell is excessively written, the process returns to initial step S1.

Distribution of memory cells when overerase recovery OER2 is performed in the first embodiment of the present invention will be described with reference to FIG. 8.

Figure 8:
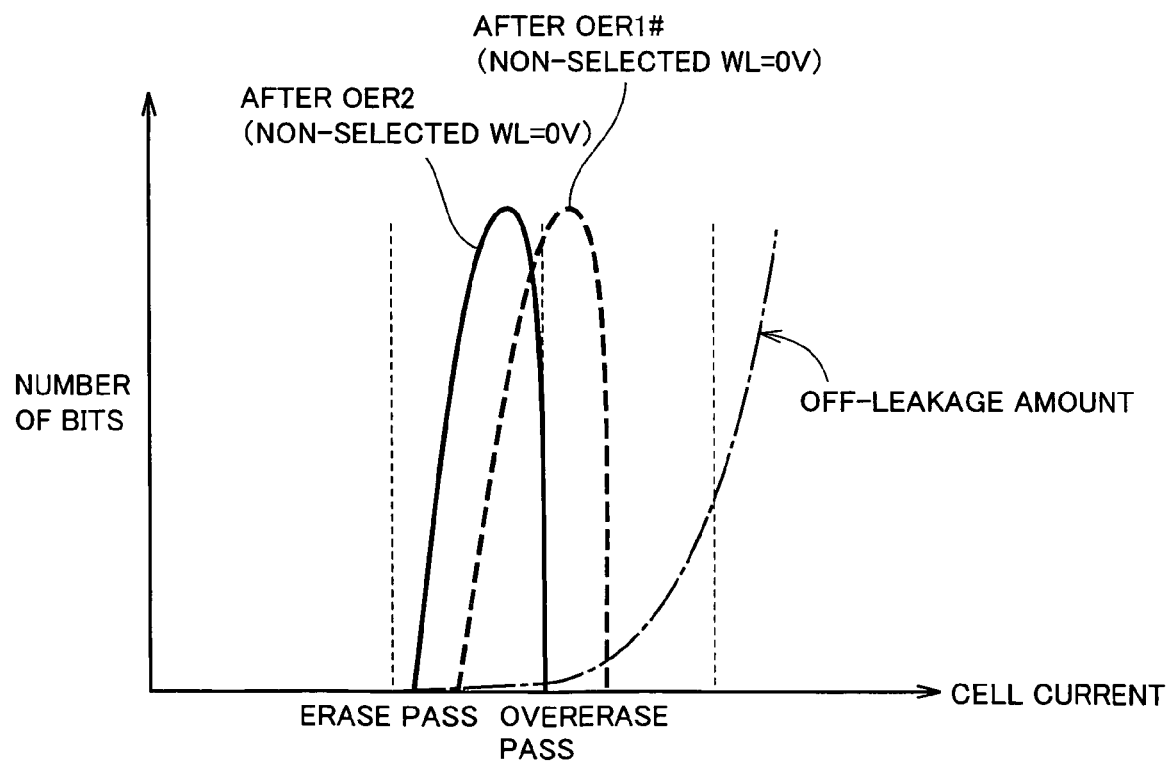
FIG. 8 illustrates distribution of memory cells when overerase recovery is performed in the first embodiment of the present invention.

As shown in FIG. 8, while maintaining distribution substantially the same as after OER1#, distribution of the memory cells is shifted to the left in a direction in which the cell current decreases, and the distribution of the memory cells is accommodated between the erase pass and the overerase pass. Accordingly, the off-leakage current can be reduced.

As a result of block-round type overerase verify OER1# between overerase recovery OER1 and overerase recovery OER2 as in the first embodiment, write back to the memory cells in the overerased state among all memory cells can gradually be performed, so that data erase can be performed while suppressing variation of the memory cell distribution.

Figure 9:
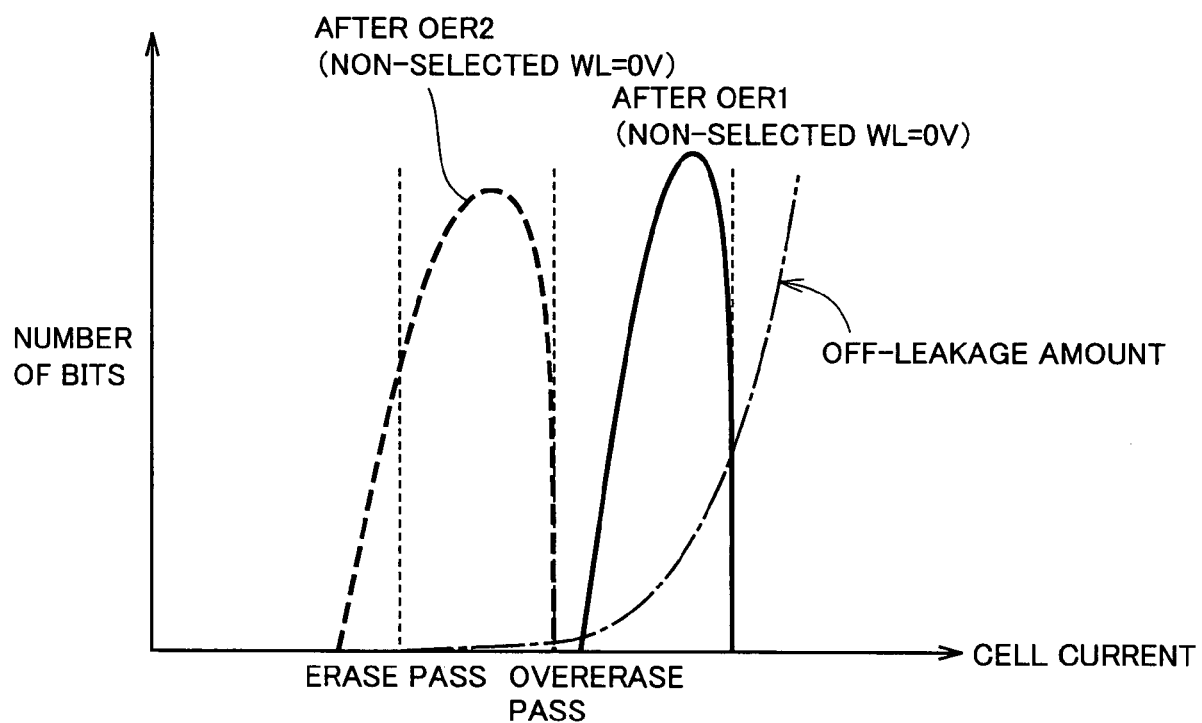
FIG. 9 illustrates distribution of memory cells when overerase recovery is performed according to a conventional scheme.

FIG. 9 illustrates distribution of memory cells when overerase recovery OER2 is performed according to a conventional scheme.

If an amount of shift from overerase recovery OER1 to overerase recovery OER2 is great, there will be a difference in a degree of influence, for example, between influence based on the off-leakage of the memory cell corresponding to the address that is accessed first and influence based on the off-leakage amount of the memory cell corresponding to the address that is accessed last. In the case of the memory cell corresponding to the address that is accessed first, an off-leakage amount of another memory cell is added without exception. Therefore, write back to such an extent as beyond the erase pass as shown in FIG. 9 is caused.

If the shift is made at a time from after overerase recovery OER1 to after overerase recovery OER2 and if the amount of shift is great, distribution beyond the erase pass is more likely. Therefore, as according to the present embodiment, shift is made gradually so that the distribution can be accommodated between the erase pass and the overerase pass with its shape being substantially maintained.

According to the method of erasing data in a non-volatile semiconductor memory device of the present embodiment, variation is suppressed, taking into consideration the off-leakage amount under the actual condition and a method of erasing data in the memory cell with high reliability can be obtained, for performing verify under the condition of actual data read, that is, under the condition where non-selected word line WL is set to a normal condition and for performing overerase recovery.

Variation of First Embodiment

A method of erasing data in a non-volatile semiconductor memory device according to a variation of the first embodiment of the present invention will be described with reference to FIG. 10.

Figure 4:
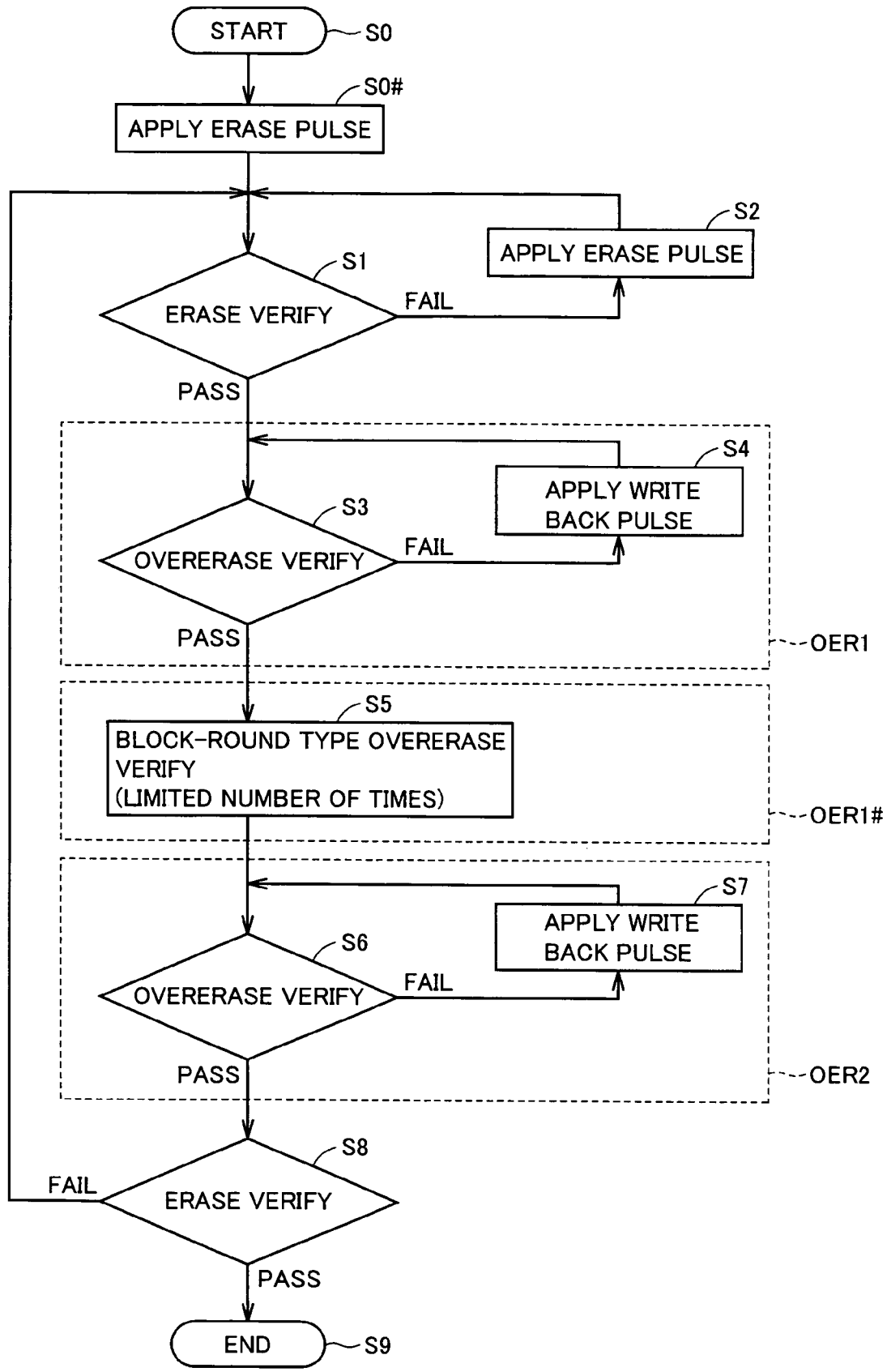
FIG. 4 is a flowchart illustrating a method of erasing data in a non-volatile semiconductor memory device according to a first embodiment of the present invention.
Figure 10:
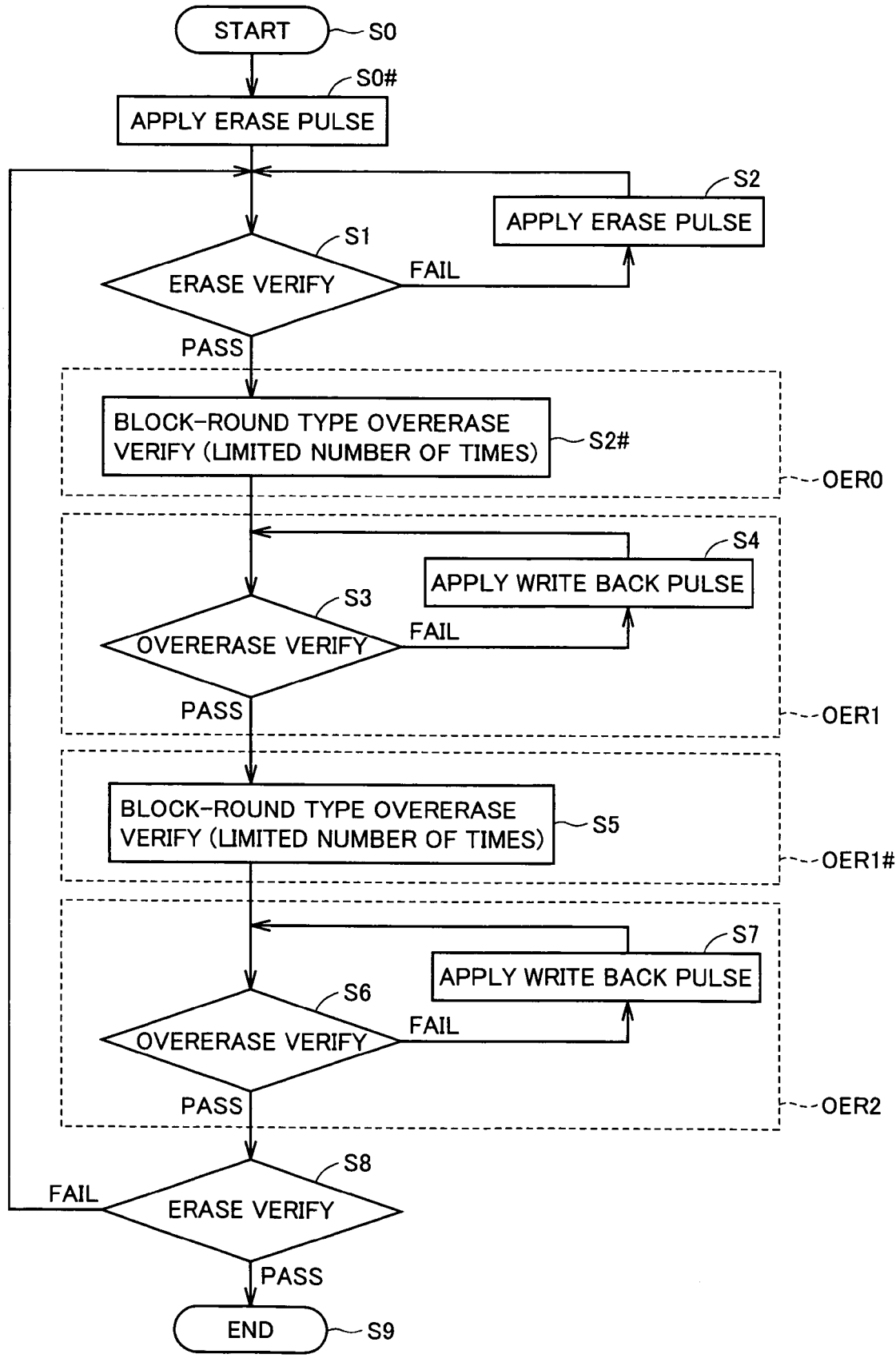
FIG. 10 is a flowchart illustrating a method of erasing data in a non-volatile semiconductor memory device according to a variation of the first embodiment of the present invention.

Referring to FIG. 10, the method according to the variation is different from the method of erasing data in a non-volatile semiconductor memory device in FIG. 4 in that block-round type overerase verify S2# is performed between step S1 and step S3. Specifically, after erase verify (step S1) is performed, block-round type overerase verify is performed (step S2#).

Distribution of memory cells after erase verify and a distribution state of memory cells after OER1# will now be described with reference to FIG. 11.

Figure 11:
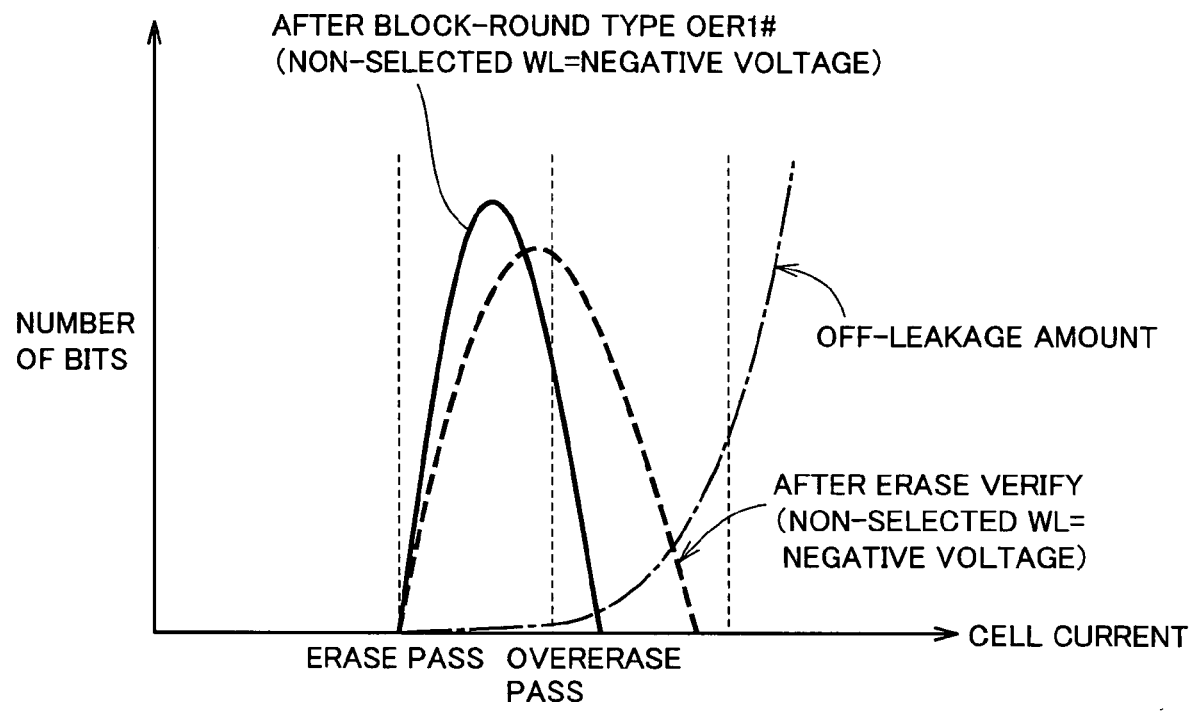
FIG. 11 illustrates distribution of memory cells after erase verify and a distribution state of memory cells after block-round type overerase verify.

As shown with a dashed line in FIG. 11, distribution of the memory cells after erase verify is considerably widespread. Though not shown, memory cells extremely distant from the overerase pass are also present. Namely, as described above in the first embodiment, a large number of memory cells are distributed beyond the overerase pass, although they are in the erase pass state.

In the method of erasing data in a non-volatile semiconductor memory device according to the variation of the first embodiment, block-round type overerase verify S2# is performed after the erase operation. In block-round type overerase verify, it is not that write back to the same address is repeatedly performed, but that write back is evenly performed along with address increment, without depending on the result of verify.

Therefore, if an abnormal, overerased memory cell in which off-leakage cannot be cut is present even when non-selected word line WL is set to e.g., a negative voltage (−2V), write back may be repeated many times uselessly, i.e., inefficiently, because overerase verify with respect to the selected memory cell is not determined as pass due to presence of the overerased memory cell. In the variation of the first embodiment, however, write back is performed gradually and evenly, and it is not necessary to perform a useless write back operation, whereby the write back operation with respect to the overerased memory cell can efficiently be performed.

Second Embodiment

A method of erasing data in a non-volatile semiconductor memory device according to a second embodiment of the present invention will now be described with reference to FIG. 12.

Figure 12:
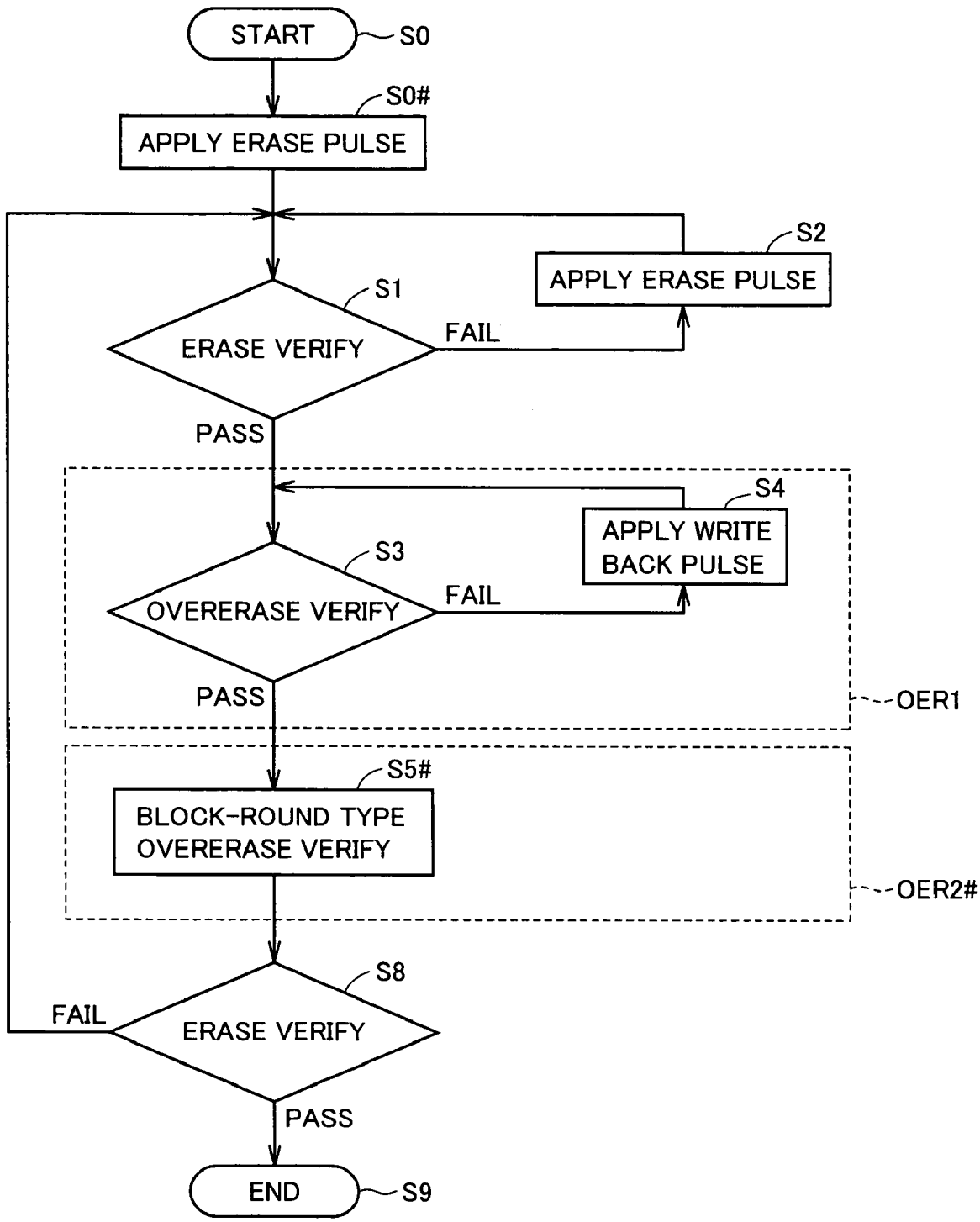
FIG. 12 is a flowchart illustrating a method of erasing data in a non-volatile semiconductor memory device according to a second embodiment of the present invention.

Referring to FIG. 12, the method of the present embodiment is different from the method of erasing data in a non-volatile semiconductor memory device in FIG. 4 in that overerase recovery OER2 has been eliminated and that block-round type overerase verify S5# is performed instead of block-round type overerase verify S5 (limited number of times).

A flowchart of block-round type overerase verify according to the second embodiment of the present invention will be described in detail with reference to FIG. 13.

Figure 13:
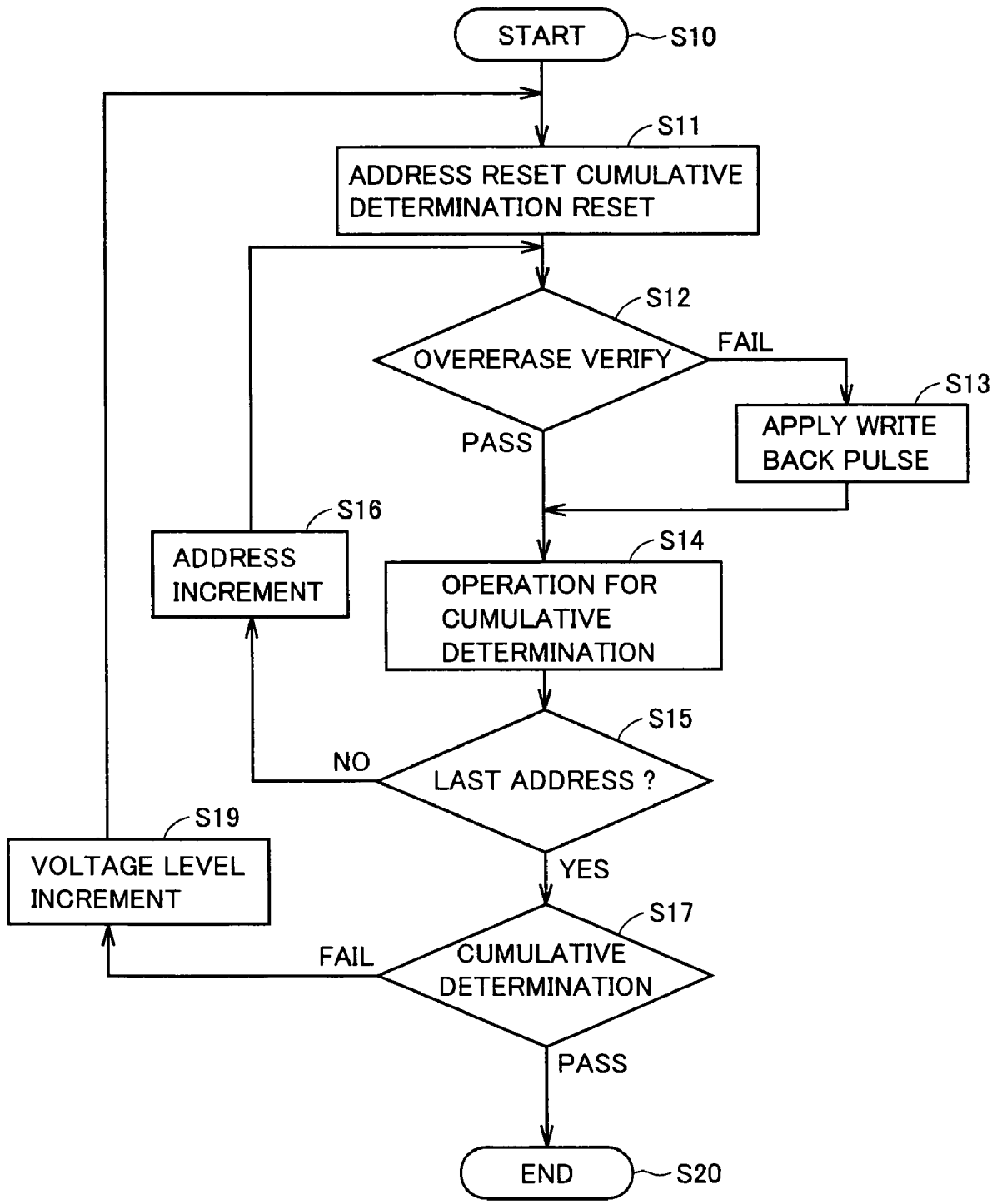
FIG. 13 illustrates in detail a flowchart for block-round type overerase verify according to the second embodiment of the present invention.

Referring to FIG. 13, block-round type overerase verify according to the second embodiment of the present invention is different from the block-round type overerase verify according to the first embodiment described with reference to FIG. 6 in that step S18 "PULSE APPLICATION OF PREDETERMINED NUMBER OF TIMES END?" has been eliminated and that the process proceeds to voltage level increment (step S19) when determination as fail is made in cumulative determination at step S17. Specifically, block-round type overerase verify according to the first embodiment described above has adopted a scheme in which the process proceeds to next overerase recovery OER2 regardless of the result of verify, when application of pulse is performed for a predetermined number of times, because the number of times of pulse application has been limited. In the method of erasing data in a non-volatile semiconductor memory device according to the second embodiment of the present invention, however, unless determination as pass is made in the block-round type overerase verify, the process does not proceed to the next step, but instead write back is repeated.

Figure 14:
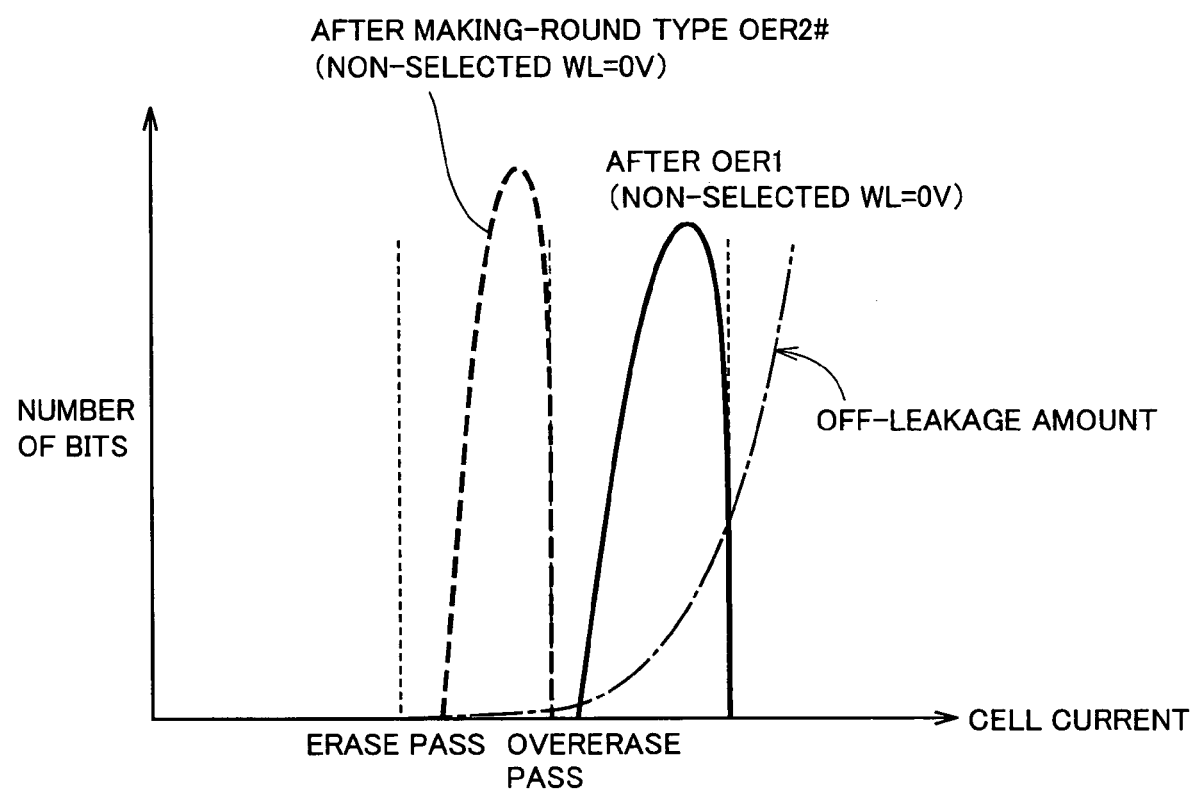
FIG. 14 illustrates distribution of memory cells after block-round type overerase verify, as a result of execution of overerase recovery according to the second embodiment of the present invention.

Therefore, by adopting this scheme, write back to all memory cells is gradually performed and excessive write is not likely. As shown in FIG. 14, by performing overerase recovery OER2# according to the second embodiment of the present invention, distribution of the memory cells can be shifted to the left in a direction in which the off-leakage amount decreases while maintaining distribution substantially the same as after OER1#, and accommodated between the erase pass and the overerase pass with high accuracy.

Variation of Second Embodiment

A method of erasing data in a non-volatile semiconductor memory device according to a variation of the second embodiment of the present invention will be described with reference to FIG. 15.

Figure 15:
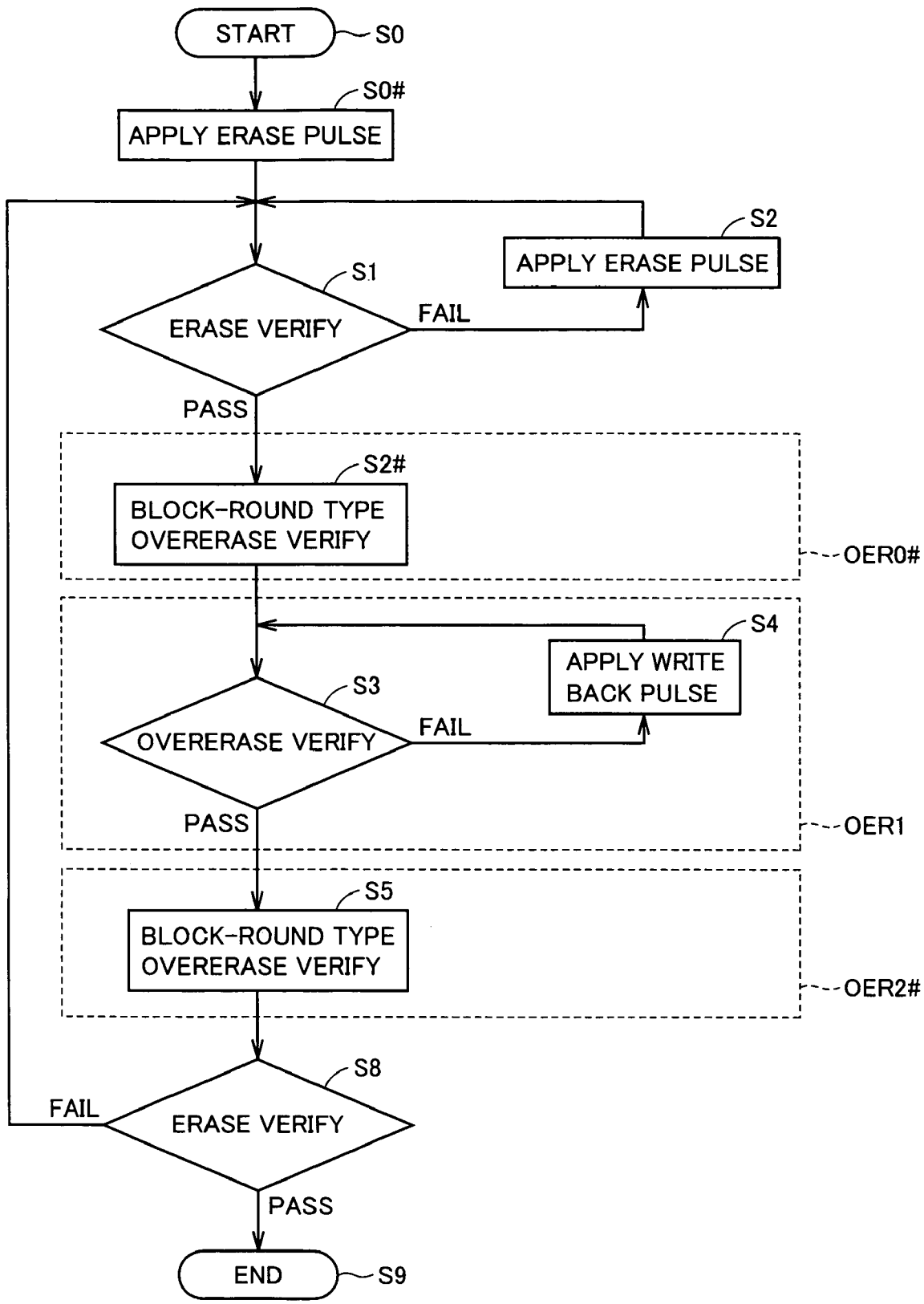
FIG. 15 is a flowchart illustrating a method of erasing data in a non-volatile semiconductor memory device according to a variation of the second embodiment of the present invention.

Referring to FIG. 15, the method according to the variation is different from the method of erasing data in a non-volatile semiconductor memory device in FIG. 12 in that block-round type overerase verify S2# is performed between step S1 and step S3. Specifically, block-round type overerase verify is performed (step S2#) after erase verify (step S1).

The present variation is similar to the variation of the first embodiment described above. As discussed above, a large number of memory cells are distributed beyond the overerase pass, although they are in the erase pass state.

In the method of erasing data in a non-volatile semiconductor memory device according to the variation of the second embodiment, block-round type overerase verify S2# is performed after the erase operation. In block-round type overerase verify, it is not that write back to the same address is repeatedly performed, but write back is evenly performed along with address increment, without depending on the result of verify.

Therefore, if an abnormal, overerased memory cell is present in which off-leakage cannot be cut even when non-selected word line WL is set to a negative voltage (-2V) as well, write back may be repeated many times uselessly, because overerase verify with respect to the selected memory cell is not determined as pass due to presence of the overerased memory cell. In the variation of the second embodiment, however, write back is performed gradually and evenly, and it is not necessary to perform a useless write back operation, whereby the write back operation can efficiently be performed.

An operation in overerase recovery OER0#, OER1 will be described in detail with reference to FIG. 16.

Figure 16:
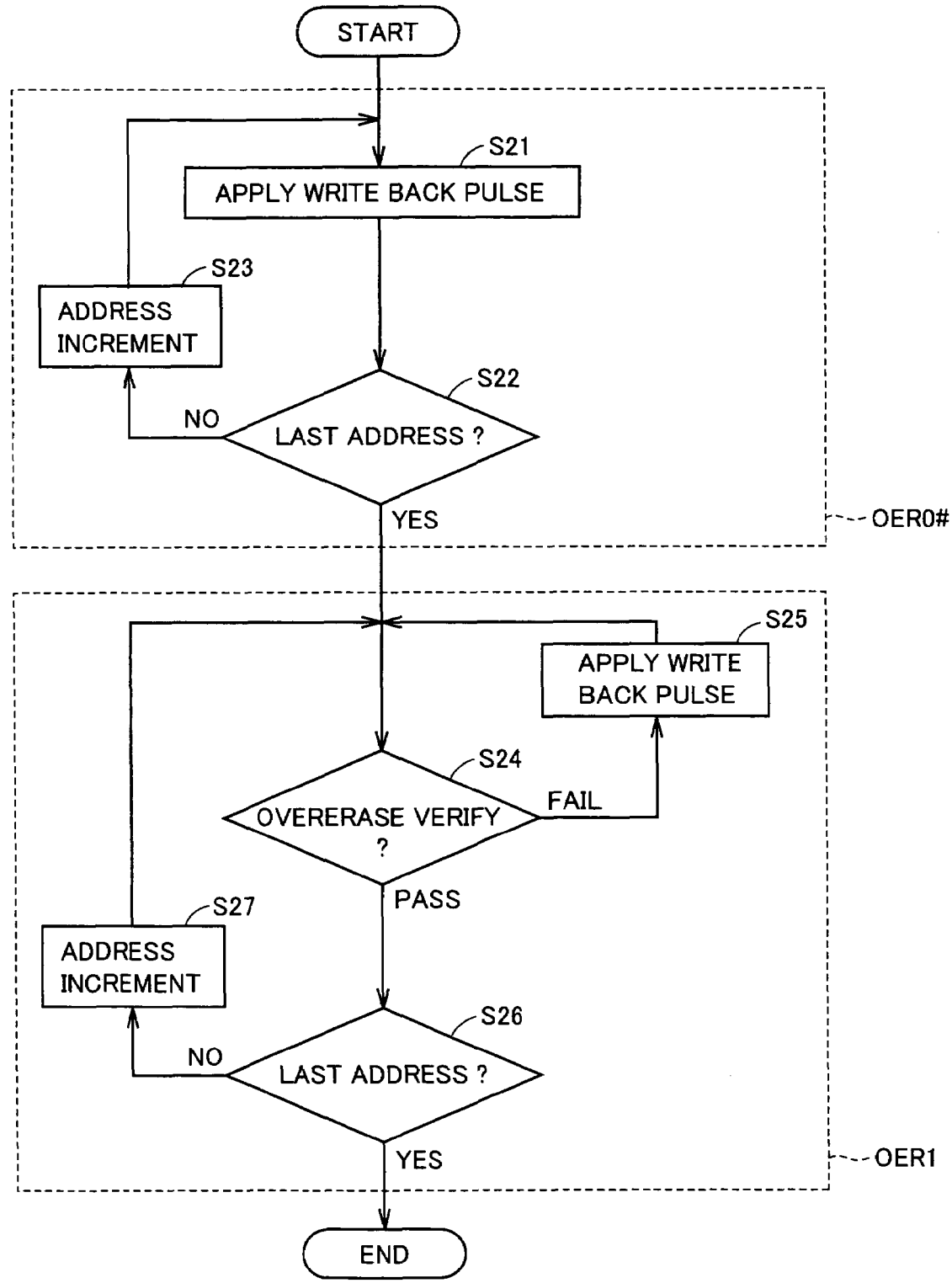
FIG. 16 is a flowchart illustrating in detail an operation in overerase recovery.

Referring to FIG. 16, in overerase recovery OER0#, after determination as PASS is made in erase verify (step S1), a write back pulse is applied (step S21). Thereafter, whether or not an address of the memory cell to be subjected to verify is the last address is determined (step S22). If the address of the memory cell to be subjected to verify is not the last address, address increment is performed (step S23) and a write back pulse is applied to the memory cell corresponding to a different address (step S21).

On the other hand, in overerase recovery OER1, overerase verify is performed (step S24). If determination as fail is made, write back pulse application (step S25) is performed and the process returns to step S24. Whether or not the address of the memory cell to be subjected to verify is the last address is again determined (step S26), and overerase recovery is repeated until the last address is reached, along with address increment (step S27). As overerase recovery OER1 is the same as described above, detailed description thereof will not be repeated.

Overerase recovery OER0# is different from OER0 in that overerase verify is not performed, that a cumulative determination operation is not performed, and that voltage level increment is not performed.

Figure 17:
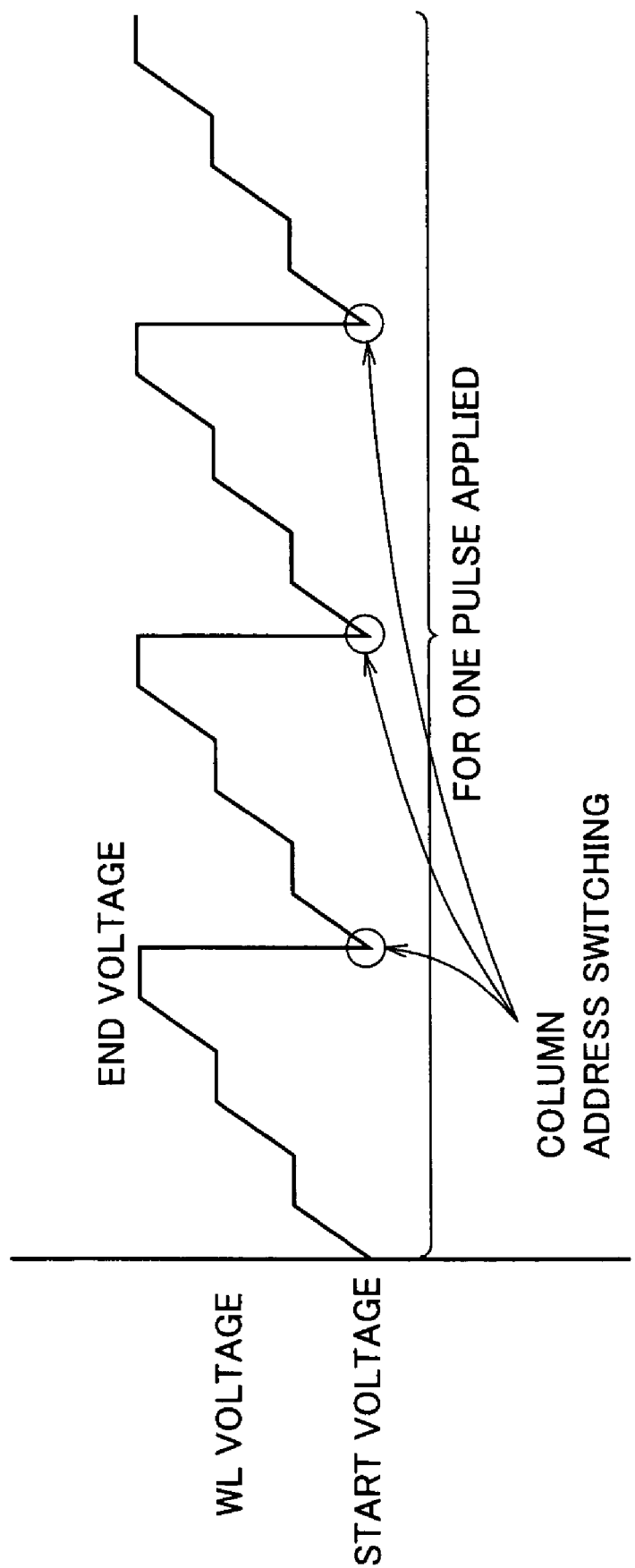
FIG. 17 illustrates an operational waveform of overerase recovery OER#0.

FIG. 17 illustrates an operational waveform of overerase recovery OER#0.

FIG. 17 shows an example in which a column address is switched three times along with address increment. Though voltage level increment is not performed, an end voltage that has been set in advance can be applied to word line WL. As the cumulative determination operation and the verify operation are not performed, a time period therefor is saved, thereby achieving high-speed overerase recovery. Namely, even if an overerased memory cell is present, a time period for erase can be shortened and a non-volatile memory cell of high reliability can be obtained. Though solely switching of the column address is shown, a row address may be switched similarly.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of erasing data in a non-volatile semiconductor memory device, for repeatedly performing at least one of verify and write with respect to a plurality of memory cell transistors arranged in an integrated manner in matrix so that a threshold voltage is within a range from at least a first voltage to at most a second voltage, comprising the steps of:

performing an erase operation so that the threshold voltage of each of said memory cell transistors is set to at most said second voltage; and performing a verify write operation, in which verify is performed in such a manner that said first voltage is applied to a control gate of a memory cell transistor corresponding to a selected memory cell row, to carry out threshold voltage determination as to whether the memory cell transistor is to be turned on or remains off, and write is performed based on a result of verify; wherein said step of performing a verify write operation includes the steps of performing first verify write, in which verify is performed in such a manner that said first voltage is applied to the control gate of the memory cell transistor corresponding to the selected memory cell row and a third voltage lower than a normal off voltage is applied to a control gate of a memory cell transistor corresponding to a non-selected memory cell row, and write to the memory cell transistor corresponding to the selected memory cell row is repeated based on a result of verify, and performing second verify write, in which verify is performed in such a manner that said first voltage is applied to the control gate of the memory cell transistor corresponding to the selected memory cell row and the normal off voltage is applied to the control gate of the memory cell transistor corresponding to the non-selected memory cell row, and write to the selected memory cell row is repeated based on a result of verify, and in said step of performing second verify write, cyclic writing, in which verify is performed sequentially from the memory cell transistor corresponding to the selected memory cell row corresponding to a first address to the memory cell transistor corresponding to the selected memory cell row corresponding to a last address, once for each, and write is repeated based on a result of verify, is performed.

2. The method of erasing data in a non-volatile semiconductor memory device according to claim 1, wherein in said step of performing second verify write, after said cyclic writing is performed for prescribed times, verify is performed in such a manner that said first voltage is applied to the control gate of the memory cell transistor corresponding to the selected memory cell row and the normal off voltage is applied to the control gate of the memory cell transistor corresponding to the non-selected memory cell row, and write to the selected identical memory cell row is repeated based on a result of verify until verify is completed.

3. The method of erasing data in a non-volatile semiconductor memory device according to claim 2, wherein said step of performing a verify write operation further includes the step of performing third verify write before said first verify write operation, in which verify is performed in such a manner that said first voltage is applied to the control gate of the memory cell transistor corresponding to the selected memory cell row and said third voltage is applied to the control gate of the memory cell transistor corresponding to the non-selected memory cell row, and write to the selected memory cell row is repeated based on a result of verify, and in said step of performing third verify write, cyclic writing, in which verify is performed sequentially from the memory cell transistor corresponding to the selected memory cell row corresponding to a first address to the memory cell transistor corresponding to the selected memory cell row corresponding to a last address, once for each, and write is repeated based on a result of verify, is performed.

4. The method of erasing data in a non-volatile semiconductor memory device according to claim 1, wherein said step of performing a verify write operation further includes the step of performing third verify write before said first verify write operation, in which verify is performed in such a manner that said first voltage is applied to the control gate of the memory cell transistor corresponding to the selected memory cell row and said third voltage is applied to the control gate of the memory cell transistor corresponding to the non-selected memory cell row, and write to the selected memory cell row is repeated based on a result of verify, and in said step of performing third verify write, cyclic writing, in which verify is performed sequentially from the memory cell transistor corresponding to the selected memory cell row corresponding to a first address to the memory cell transistor corresponding to the selected memory cell row corresponding to a last address, once for each, and write is repeated based on a result of verify, is performed.

5. The method of erasing data in a non-volatile semiconductor memory device according to claim 1, further comprising the step of performing verify after the step of performing said verify write operation, in such a manner that said second voltage is applied to the control gate of each of said memory cell transistors, to determine whether the threshold voltage is not higher than said second voltage.

6. The method of erasing data in a non-volatile semiconductor memory device according to claim 1, wherein in said cyclic writing, a voltage level of a write pulse applied during write is regulated in accordance with number of times of repetition.

* * * * *